(12) United States Patent
Englekirk

(10) Patent No.: US 9,264,053 B2
(45) Date of Patent: Feb. 16, 2016

(54) VARIABLE FREQUENCY CHARGE PUMP

(71) Applicant: PEREGRINE SEMICONDUCTOR CORPORATION, San Diego, CA (US)

(72) Inventor: Robert Mark Englekirk, Pacific Palisades, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 13/933,006

(22) Filed: Jul. 1, 2013

(65) Prior Publication Data
US 2015/0002195 A1    Jan. 1, 2015

(51) Int. Cl.
H02M 3/07 (2006.01)
H03L 7/089 (2006.01)
H02M 1/00 (2007.01)

(52) U.S. Cl.
CPC .............. *H03L 7/0891* (2013.01); *H02M 3/07* (2013.01); *H02M 3/073* (2013.01); *H02M 2001/0032* (2013.01)

(58) Field of Classification Search
CPC ................................. H02M 3/07; H02M 3/073
USPC ......................................................... 326/536
See application file for complete search history.

(56) References Cited

U.S. PATENT DOCUMENTS

| | | | |
|---|---|---|---|
| 3,469,212 A | 9/1969 | Georg et al. | |
| 3,470,443 A | 9/1969 | Berry et al. | |
| 3,646,361 A | 2/1972 | Pfiffner | |
| 3,731,112 A | 5/1973 | Smith | |
| 3,878,450 A | 4/1975 | Greatbatch | |
| 3,942,047 A | 3/1976 | Buchanan | |
| 3,943,428 A | 3/1976 | Whidden | |
| 3,955,353 A | 5/1976 | Astle | |
| 3,975,671 A | 8/1976 | Stoll | |
| 3,995,228 A | 11/1976 | Pass et al. | |

(Continued)

FOREIGN PATENT DOCUMENTS

DE    102005039138 A1    2/2007
EP           385641       9/1990

(Continued)

OTHER PUBLICATIONS

Wells, Kenneth B., Office Action received from the USPTO dated Feb. 13, 2013 for related U.S. Appl. No. 13/105,743, 55 pgs.

(Continued)

*Primary Examiner* — Thomas J Hiltunen
(74) *Attorney, Agent, or Firm* — Jaquez Land Richman LLP; Martin J. Jaquez, Esq.; John Land, Esq.

(57) ABSTRACT

A charge pump circuit that utilizes a sensing circuit for determining the current loading or status of the output supply generated by the charge pump circuit to determine a corresponding frequency for a variable rate clock for the charge pump circuit. When a current load is present, the clock frequency automatically ramps up to a relatively high level to increase the output current of the charge pump circuit. When the current load is removed and the supply is settled out, the clock frequency is automatically reduced to a relatively quieter level and the charge pump circuitry operates at a lower power level. Accordingly, the charge pump circuit is only noisy when it has to be, thus providing optimal power when required and being electrically quiet and operating at lower power at all other times.

18 Claims, 2 Drawing Sheets

(56) References Cited

U.S. PATENT DOCUMENTS

| | | | |
|---|---|---|---|
| 4,047,091 A | 9/1977 | Hutchines et al. |
| 4,061,929 A | 12/1977 | Asano |
| 4,068,295 A | 1/1978 | Portmann |
| 4,106,086 A | 8/1978 | Holbrook et al. |
| 4,158,182 A | 6/1979 | Washburn |
| 4,186,436 A | 1/1980 | Ishiwatari |
| 4,316,101 A | 2/1982 | Minner |
| 4,321,661 A | 3/1982 | Sano |
| 4,344,050 A | 8/1982 | Callahan |
| 4,374,357 A | 2/1983 | Olesin et al. |
| 4,388,537 A | 6/1983 | Kanuma |
| 4,390,798 A | 6/1983 | Kurafuji |
| 4,460,952 A | 7/1984 | Risinger |
| RE31,749 E | 11/1984 | Yamashiro |
| 4,485,433 A | 11/1984 | Topich |
| 4,528,517 A | 7/1985 | Schlotzhauer |
| 4,575,644 A | 3/1986 | Leslie |
| 4,621,315 A | 11/1986 | Vaughn et al. |
| 4,633,106 A | 12/1986 | Backes et al. |
| 4,638,184 A | 1/1987 | Kimura |
| 4,679,134 A | 7/1987 | Bingham |
| 4,703,196 A | 10/1987 | Arakawa |
| 4,736,169 A | 4/1988 | Weaver et al. |
| 4,739,191 A | 4/1988 | Puar |
| 4,746,960 A | 5/1988 | Valeri et al. |
| 4,752,699 A | 6/1988 | Cranford, Jr. et al. |
| 4,769,784 A | 9/1988 | Doluca et al. |
| 4,777,577 A | 10/1988 | Bingham et al. |
| 4,839,787 A | 6/1989 | Kojima et al. |
| 4,847,519 A | 7/1989 | Wahl et al. |
| 4,891,609 A | 1/1990 | Eilley |
| 4,897,774 A | 1/1990 | Bingham et al. |
| 4,918,336 A * | 4/1990 | Graham et al. ............... 326/117 |
| 5,023,465 A | 6/1991 | Douglas et al. |
| 5,023,494 A | 6/1991 | Tsukii et al. |
| 5,029,282 A | 7/1991 | Ito |
| 5,032,799 A | 7/1991 | Milberger et al. |
| 5,036,229 A | 7/1991 | Tran |
| 5,038,325 A | 8/1991 | Douglas et al. |
| 5,061,907 A | 10/1991 | Rasmussen |
| 5,068,626 A | 11/1991 | Takagi et al. |
| 5,075,572 A | 12/1991 | Poteet et al. |
| 5,081,371 A | 1/1992 | Wong |
| 5,111,375 A | 5/1992 | Marshall |
| 5,124,571 A | 6/1992 | Gillingham et al. |
| 5,126,590 A | 6/1992 | Chern |
| 5,138,190 A | 8/1992 | Yamazaki et al. |
| 5,146,178 A | 9/1992 | Nojima et al. |
| 5,180,928 A | 1/1993 | Choi |
| 5,182,529 A | 1/1993 | Chern |
| 5,193,198 A | 3/1993 | Yokouchi |
| 5,196,996 A | 3/1993 | Oh |
| 5,208,557 A | 5/1993 | Kersh, III |
| 5,212,456 A | 5/1993 | Kovalcik et al. |
| 5,216,588 A | 6/1993 | Bajwa et al. |
| 5,274,343 A | 12/1993 | Russell et al. |
| 5,289,137 A | 2/1994 | Nodar et al. |
| 5,306,954 A | 4/1994 | Chan et al. |
| 5,317,181 A | 5/1994 | Tyson |
| 5,331,221 A | 7/1994 | Ganesan et al. |
| 5,392,186 A | 2/1995 | Alexander et al. |
| 5,392,205 A | 2/1995 | Zavaleta |
| 5,394,372 A | 2/1995 | Tanaka et al. |
| 5,408,140 A | 4/1995 | Kawai et al. |
| 5,418,499 A | 5/1995 | Nakao |
| 5,422,586 A | 6/1995 | Tedrow et al. |
| 5,446,418 A | 8/1995 | Hara et al. |
| 5,455,794 A | 10/1995 | Javanifard et al. |
| 5,465,061 A | 11/1995 | Dufour |
| 5,483,195 A | 1/1996 | Brown |
| 5,483,434 A * | 1/1996 | Seesink ............... 363/60 |
| 5,493,249 A | 2/1996 | Manning |
| 5,519,360 A | 5/1996 | Keeth |
| 5,528,245 A | 6/1996 | Aker et al. |
| 5,535,160 A | 7/1996 | Yamaguchi |
| 5,546,031 A * | 8/1996 | Seesink ............... 327/155 |
| 5,553,021 A | 9/1996 | Kubono et al. |
| 5,554,892 A | 9/1996 | Norimatsu |
| 5,589,793 A | 12/1996 | Kassapian |
| 5,600,281 A | 2/1997 | Mori et al. |
| 5,670,907 A | 9/1997 | Gorecki et al. |
| 5,672,992 A | 9/1997 | Nadd |
| 5,677,649 A | 10/1997 | Martin |
| 5,677,650 A | 10/1997 | Kwasniewski et al. |
| 5,689,213 A | 11/1997 | Sher |
| 5,694,308 A | 12/1997 | Cave |
| 5,698,877 A | 12/1997 | Gonzalez |
| 5,729,039 A | 3/1998 | Beyer et al. |
| 5,734,291 A | 3/1998 | Tasdighi et al. |
| 5,757,170 A | 5/1998 | Pinney |
| 5,786,617 A | 7/1998 | Merrill et al. |
| 5,793,246 A | 8/1998 | Vest et al. |
| 5,808,505 A | 9/1998 | Tsukada |
| 5,812,939 A | 9/1998 | Kohama |
| 5,818,289 A | 10/1998 | Chevallier et al. |
| 5,818,766 A * | 10/1998 | Song ............... 365/189.11 |
| 5,864,328 A | 1/1999 | Kajimoto |
| 5,874,849 A | 2/1999 | Marotta et al. |
| 5,878,331 A | 3/1999 | Yamamoto et al. |
| 5,889,428 A | 3/1999 | Young |
| 5,892,400 A | 4/1999 | van Saders et al. |
| 5,917,362 A | 6/1999 | Kohama |
| 5,945,867 A | 8/1999 | Uda et al. |
| 5,959,335 A | 9/1999 | Bryant et al. |
| 5,969,988 A | 10/1999 | Tanzawa et al. |
| 6,020,781 A | 2/2000 | Fujioka |
| 6,064,275 A | 5/2000 | Yamauchi |
| 6,064,872 A | 5/2000 | Vice |
| 6,081,165 A | 6/2000 | Goldman |
| 6,087,968 A | 7/2000 | Roza |
| 6,094,103 A | 7/2000 | Jeong et al. |
| 6,107,885 A | 8/2000 | Miguelez et al. |
| 6,122,185 A | 9/2000 | Utsunomiya et al. |
| 6,130,572 A | 10/2000 | Ghilardelli et al. |
| 6,169,444 B1 | 1/2001 | Thurber, Jr. |
| 6,188,590 B1 | 2/2001 | Chang et al. |
| 6,195,307 B1 | 2/2001 | Umezawa et al. |
| RE37,124 E | 4/2001 | Monk et al. |
| 6,226,206 B1 | 5/2001 | Maeda |
| 6,249,446 B1 | 6/2001 | Shearon et al. |
| 6,297,687 B1 | 10/2001 | Sugimura |
| 6,308,047 B1 | 10/2001 | Yamamoto et al. |
| 6,337,594 B1 | 1/2002 | Hwang |
| 6,339,349 B1 | 1/2002 | Rajagopalan |
| 6,356,062 B1 * | 3/2002 | Elmhurst et al. ............... 323/282 |
| 6,400,211 B1 * | 6/2002 | Yokomizo et al. ............ 327/536 |
| 6,411,531 B1 | 6/2002 | Nork et al. |
| 6,414,863 B1 | 7/2002 | Bayer et al. |
| 6,424,585 B1 | 7/2002 | Ooishi |
| 6,429,632 B1 | 8/2002 | Forbes et al. |
| 6,429,723 B1 | 8/2002 | Hastings |
| 6,429,730 B2 | 8/2002 | Houghton et al. |
| 6,429,732 B1 | 8/2002 | Tedrow et al. |
| 6,452,232 B1 | 9/2002 | Adan |
| 6,486,728 B2 | 11/2002 | Kleveland |
| 6,486,729 B2 | 11/2002 | Imamiya |
| 6,496,074 B1 | 12/2002 | Sowlati |
| 6,504,213 B1 | 1/2003 | Ebina |
| 6,518,829 B2 | 2/2003 | Butler |
| 6,535,071 B2 | 3/2003 | Forbes |
| 6,537,861 B1 | 3/2003 | Kroell et al. |
| 6,559,689 B1 | 5/2003 | Clark |
| 6,563,366 B1 | 5/2003 | Kohama |
| 6,617,933 B2 | 9/2003 | Ito et al. |
| 6,653,697 B2 | 11/2003 | Hidaka et al. |
| 6,661,682 B2 | 12/2003 | Kim |
| 6,677,641 B2 | 1/2004 | Kocon |
| 6,714,065 B2 | 3/2004 | Komiya et al. |
| 6,717,458 B1 | 4/2004 | Potanin |
| 6,737,926 B2 | 5/2004 | Forbes |
| 6,744,224 B2 * | 6/2004 | Ishii ............... 315/291 |
| 6,762,704 B1 | 7/2004 | Melanson et al. |
| 6,784,737 B2 | 8/2004 | Martin et al. |
| 6,788,130 B2 | 9/2004 | Pauletti et al. |

(56) References Cited

U.S. PATENT DOCUMENTS

| | | |
|---|---|---|
| 6,788,578 B1 | 9/2004 | Tang |
| 6,794,927 B2 | 9/2004 | Bedarida et al. |
| 6,801,076 B1 | 10/2004 | Merritt |
| 6,803,807 B2 | 10/2004 | Fujiyama et al. |
| 6,806,761 B1 | 10/2004 | Aude |
| 6,809,603 B1 | 10/2004 | Ho |
| 6,812,775 B2 | 11/2004 | Seo |
| 6,816,000 B2 | 11/2004 | Miyamitsu |
| 6,816,001 B2 | 11/2004 | Khouri et al. |
| 6,816,016 B2 | 11/2004 | Sander et al. |
| 6,819,187 B1 | 11/2004 | Ming et al. |
| 6,819,938 B2 | 11/2004 | Sahota |
| 6,825,699 B2 | 11/2004 | Marshall et al. |
| 6,825,730 B1 | 11/2004 | Sun |
| 6,828,614 B2 | 12/2004 | Gonzalez |
| 6,831,499 B2 | 12/2004 | Oddone et al. |
| 6,831,847 B2 | 12/2004 | Perry |
| 6,833,745 B2 | 12/2004 | Hausmann et al. |
| 6,833,752 B2 | 12/2004 | Merritt et al. |
| 6,836,173 B1 | 12/2004 | Yang |
| 6,836,176 B2 * | 12/2004 | Zeng et al. ............... 327/535 |
| 6,844,762 B2 | 1/2005 | Sanchez |
| 6,847,251 B2 | 1/2005 | Kao |
| 6,853,566 B2 | 2/2005 | Itoh |
| 6,855,655 B2 | 2/2005 | Wagner et al. |
| 6,856,177 B1 | 2/2005 | de Frutos et al. |
| 6,871,059 B1 | 3/2005 | Piro et al. |
| 6,879,502 B2 | 4/2005 | Yoshida et al. |
| 6,891,234 B1 | 5/2005 | Connelly et al. |
| 6,906,575 B2 | 6/2005 | Tanaka |
| 6,947,720 B2 | 9/2005 | Razavi et al. |
| 6,954,623 B2 | 10/2005 | Chang et al. |
| 6,967,523 B2 | 11/2005 | DeMone |
| 7,023,260 B2 | 4/2006 | Thorp et al. |
| 7,042,245 B2 | 5/2006 | Hidaka |
| 7,098,734 B2 | 8/2006 | Hongo et al. |
| 7,109,532 B1 | 9/2006 | Lee et al. |
| 7,123,898 B2 | 10/2006 | Burgener et al. |
| 7,129,796 B2 | 10/2006 | Goto |
| 7,161,197 B2 | 1/2007 | Nakatsuka et al. |
| 7,180,794 B2 * | 2/2007 | Matsue ............... 365/189.09 |
| 7,190,222 B2 | 3/2007 | Okazaki et al. |
| 7,202,712 B2 | 4/2007 | Athas |
| 7,212,788 B2 | 5/2007 | Weber et al. |
| 7,355,455 B2 | 4/2008 | Hidaka |
| 7,359,677 B2 | 4/2008 | Huang et al. |
| 7,391,282 B2 | 6/2008 | Nakatsuka et al. |
| 7,430,133 B1 * | 9/2008 | McIntyre et al. ............... 363/60 |
| 7,457,594 B2 | 11/2008 | Theobold et al. |
| 7,460,852 B2 | 12/2008 | Burgener et al. |
| 7,486,128 B2 * | 2/2009 | Yen et al. ............... 327/536 |
| 7,515,882 B2 | 4/2009 | Kelcourse et al. |
| 7,545,216 B2 | 6/2009 | Hamley |
| 7,546,089 B2 | 6/2009 | Bellantoni |
| 7,551,036 B2 | 6/2009 | Berroth et al. |
| 7,560,977 B2 | 7/2009 | Miyazaki et al. |
| 7,602,227 B2 | 10/2009 | Kim et al. |
| 7,609,109 B2 | 10/2009 | Arisawa |
| 7,659,152 B2 | 2/2010 | Gonzalez et al. |
| 7,667,529 B2 * | 2/2010 | Consuelo et al. ............... 327/536 |
| 7,719,343 B2 | 5/2010 | Burgener et al. |
| 7,733,156 B2 | 6/2010 | Brederlow et al. |
| 7,733,157 B2 | 6/2010 | Brederlow et al. |
| 7,741,869 B2 | 6/2010 | Hidaka |
| 7,756,494 B2 | 7/2010 | Fujioka et al. |
| 7,786,807 B1 | 8/2010 | Li et al. |
| 7,796,969 B2 | 9/2010 | Kelly et al. |
| 7,817,966 B2 | 10/2010 | Prikhodko et al. |
| 7,860,499 B2 | 12/2010 | Burgener et al. |
| 7,868,683 B2 | 1/2011 | Ilkov |
| 7,910,993 B2 | 3/2011 | Brindle et al. |
| 7,920,026 B2 | 4/2011 | Hughes |
| 7,928,759 B2 | 4/2011 | Hidaka |
| 7,936,213 B2 | 5/2011 | Shin et al. |
| 7,944,277 B1 * | 5/2011 | Sinitsky et al. ............... 327/536 |
| 7,956,675 B2 * | 6/2011 | Saitoh et al. ............... 327/536 |
| 7,969,235 B2 | 6/2011 | Pan |
| 7,982,265 B2 | 7/2011 | Challa et al. |
| 8,072,258 B2 | 12/2011 | Yamahira |
| 8,103,226 B2 | 1/2012 | Andrys et al. |
| 8,131,251 B2 | 3/2012 | Burgener et al. |
| 8,195,103 B2 | 6/2012 | Waheed et al. |
| 8,253,494 B2 | 8/2012 | Biednov |
| 8,373,490 B2 | 2/2013 | Burgener et al. |
| 8,378,736 B2 | 2/2013 | Burgener et al. |
| 8,497,670 B1 * | 7/2013 | Molin et al. ............... 323/293 |
| 8,559,907 B2 | 10/2013 | Burgener et al. |
| 8,649,754 B2 | 2/2014 | Burgener et al. |
| 8,674,749 B2 * | 3/2014 | Tran et al. ............... 327/536 |
| 8,686,787 B2 | 4/2014 | Swonger |
| 8,816,659 B2 | 8/2014 | Kim et al. |
| 8,994,452 B2 | 3/2015 | Kim et al. |
| 9,030,248 B2 | 5/2015 | Kim et al. |
| 9,190,902 B2 | 11/2015 | Burgener et al. |
| 2001/0013814 A1 | 8/2001 | Arisawa |
| 2001/0031518 A1 | 10/2001 | Kim et al. |
| 2002/0115244 A1 | 8/2002 | Park et al. |
| 2002/0140412 A1 | 10/2002 | Maneatis |
| 2002/0153940 A1 | 10/2002 | Wurcer et al. |
| 2002/0171486 A1 | 11/2002 | Krupnik |
| 2003/0002452 A1 | 1/2003 | Sahota |
| 2003/0034849 A1 | 2/2003 | Sanduleanu et al. |
| 2003/0090313 A1 | 5/2003 | Burgener et al. |
| 2003/0141543 A1 | 7/2003 | Bryant et al. |
| 2003/0201494 A1 | 10/2003 | Maeda et al. |
| 2004/0061130 A1 | 4/2004 | Morizuka |
| 2004/0080364 A1 | 4/2004 | Sander et al. |
| 2004/0129975 A1 | 7/2004 | Koh et al. |
| 2004/0204013 A1 | 10/2004 | Ma et al. |
| 2005/0052220 A1 | 3/2005 | Burgener et al. |
| 2005/0068102 A1 | 3/2005 | Hongo et al. |
| 2005/0077564 A1 | 4/2005 | Forbes |
| 2005/0121699 A1 | 6/2005 | Chen et al. |
| 2005/0195030 A1 | 9/2005 | Okazaki et al. |
| 2006/0006955 A1 | 1/2006 | Arisawa |
| 2006/0194558 A1 | 8/2006 | Kelly |
| 2006/0220747 A1 | 10/2006 | Kiji |
| 2006/0281418 A1 | 12/2006 | Huang et al. |
| 2006/0284670 A1 | 12/2006 | Eid et al. |
| 2007/0045697 A1 | 3/2007 | Cheng et al. |
| 2007/0069801 A1 | 3/2007 | Ragone et al. |
| 2007/0146064 A1 | 6/2007 | Morie et al. |
| 2007/0229156 A1 | 10/2007 | Alenin et al. |
| 2007/0243849 A1 | 10/2007 | Prikhodko et al. |
| 2007/0279120 A1 | 12/2007 | Brederlow et al. |
| 2008/0007980 A1 | 1/2008 | Fujiwara |
| 2008/0030237 A1 | 2/2008 | Danioni et al. |
| 2008/0044041 A1 | 2/2008 | Tucker et al. |
| 2008/0076371 A1 | 3/2008 | Dribinsky et al. |
| 2008/0116979 A1 | 5/2008 | Lesso et al. |
| 2008/0166984 A1 | 7/2008 | Shie et al. |
| 2008/0246543 A1 | 10/2008 | Trifonov et al. |
| 2008/0272833 A1 | 11/2008 | Ivanov et al. |
| 2008/0272845 A1 | 11/2008 | Willassen et al. |
| 2008/0298605 A1 | 12/2008 | Fan et al. |
| 2009/0066407 A1 | 3/2009 | Bowman et al. |
| 2009/0174495 A1 | 7/2009 | Arisawa |
| 2009/0251215 A1 | 10/2009 | Hughes |
| 2010/0033226 A1 | 2/2010 | Kim et al. |
| 2010/0052771 A1 * | 3/2010 | Hartono ............... 327/536 |
| 2010/0214010 A1 | 8/2010 | Burgener et al. |
| 2010/0245327 A1 | 9/2010 | Tsujino et al. |
| 2011/0156819 A1 | 6/2011 | Kim et al. |
| 2011/0163779 A1 | 7/2011 | Hidaka |
| 2011/0299437 A1 | 12/2011 | Mikhemar et al. |
| 2012/0007679 A1 | 1/2012 | Burgener et al. |
| 2012/0038344 A1 | 2/2012 | Kim et al. |
| 2012/0049956 A1 | 3/2012 | Lam |
| 2012/0086512 A1 | 4/2012 | Sharma et al. |
| 2012/0105127 A1 | 5/2012 | Burgener et al. |
| 2012/0148001 A1 | 6/2012 | Yashima |
| 2012/0242379 A1 * | 9/2012 | Obkircher et al. ............... 327/117 |
| 2012/0286854 A1 | 11/2012 | Swonger |
| 2013/0229841 A1 | 9/2013 | Giuliano |

(56) References Cited

U.S. PATENT DOCUMENTS

| | | | |
|---|---|---|---|
| 2013/0320955 A1* | 12/2013 | Kratyuk et al. | ............... 323/313 |
| 2014/0055194 A1 | 2/2014 | Burgener et al. | |
| 2014/0085006 A1 | 3/2014 | Mostov et al. | |
| 2014/0087673 A1 | 3/2014 | Mostov et al. | |
| 2015/0002214 A1 | 1/2015 | Englekirk | |
| 2015/0084610 A1 | 3/2015 | Kim et al. | |

FOREIGN PATENT DOCUMENTS

| | | |
|---|---|---|
| EP | 0622901 | 11/1994 |
| EP | 0 938 094 A1 | 1/1999 |
| EP | 1664966 | 7/2006 |
| EP | 2330735 A2 | 6/2011 |
| EP | 2346169 | 7/2011 |
| EP | 2385616 A2 | 9/2011 |
| EP | 2421132 | 2/2012 |
| EP | 2830203 | 1/2015 |
| GB | 2451524 | 2/2009 |
| JP | 55-75348 | 6/1980 |
| JP | 01-254014 | 11/1989 |
| JP | 04-34980 | 2/1992 |
| JP | 04-334105 | 11/1992 |
| JP | 05-111241 | 4/1993 |
| JP | 06-152334 | 5/1994 |
| JP | 06-314985 | 11/1994 |
| JP | 06-334506 | 12/1994 |
| JP | 08-148949 | 6/1996 |
| JP | 08-307305 | 11/1996 |
| JP | 09-161472 | 6/1997 |
| JP | 09-200021 | 7/1997 |
| JP | 10-93471 | 4/1998 |
| JP | 10-242477 | 9/1998 |
| JP | 10-242829 | 9/1998 |
| JP | 10-344247 | 12/1998 |
| JP | 11-136111 | 5/1999 |
| JP | 11-252900 | 9/1999 |
| JP | 2000-166220 | 6/2000 |
| JP | 2001-051758 | 2/2001 |
| JP | 2001-119281 | 4/2001 |
| JP | 2001-119927 | 4/2001 |
| JP | 2002-119053 | 4/2002 |
| JP | 03-060451 | 2/2003 |
| JP | 03-198248 | 7/2003 |
| JP | 2004-147175 | 5/2004 |
| JP | 2005-057860 | 3/2005 |
| JP | 2006-352326 | 12/2006 |
| JP | 5675529 | 1/2015 |
| WO | WO 95/23460 A1 | 8/1995 |
| WO | WO98/58382 | 12/1998 |
| WO | 2005-043267 | 5/2005 |
| WO | 2009/063661 | 5/2009 |
| WO | 2010/008586 | 1/2010 |
| WO | WO2012058122 | 5/2012 |

OTHER PUBLICATIONS

Tran, Pablo No., Notice of Allowance received from the USPTO dated Feb. 15, 2013 for related U.S. Appl. No. 12/903,848, 26 pgs.
Mehari, Yemane, Office Action received from the USPTO dated Mar. 15, 2013 for related U.S. Appl. No. 13/016,875, 83 pgs.
Kim, et al., Amendment—Response to Restriction filed in the USPTO dated Apr. 15, 2013 for U.S. Appl. No. 13/054,781, 5 pgs.
Nguyen, Hieu P., Office Action received from USPTO dated Jun. 11, 2013 for related U.S. Appl. No. 13/054,781, 45 pgs.
Swonger, James, Response filed in the USPTO dated Jun. 12, 2013 for related U.S. Appl. No. 13/105,743, 21 pgs.
Kim, et al., Amendment filed in the USPTO dated Jul. 12, 2013 for related U.S. Appl. No. 13/016,875, 8 pgs.
Tokuda, Kenji, Office Action and English Translation received from the Japanese Patent Office dated Jul. 13, 2013 for related appln. No. 2011-518737, 10 pgs.
Wells, Kenneth B., Notice of Allowance received from the USPTO dated Jul. 24, 2013 for related U.S. Appl. No. 13/105,743, 10 pgs.
Sasaki, Satoshi, English translation of Office Action received from the Japanese Patent Office dated Jul. 23, 2013 for related appln. No. 2011-171908, 2 pgs.
Mehari, Yemane, Notice of Allowance received from the USPTO dated Aug. 20, 2013 for related U.S. Appl. No. 13/016,875, 17 pgs.
Tran, Pablo N. Notice of Allowance received from the USPTO dated Aug. 28, 2013 for related U.S. Appl. No. 12/903,848, 18 pgs.
Muelemans, Bart, Extended Search Report received from the EPO dated Oct. 22, 2013 for related appln. No. 11154275.9, 6 pgs.
Wells, Kenneth B., Notice of Allowance received from the USPTO dated Nov. 7, 2013 for related U.S. Appl. No. 13/105,743, 11 pgs.
Le, Dinh Thanh, Notice of Allowance received from the USPTO dated Nov. 7, 2013 for related U.S. Appl. No. 12/460,442, 16 pgs.
Gentili, Luigi, Communication under Rule 71(3) EPC received from the EPO dated Nov. 14, 2013 for related appln. No. 04816848.8, 43 pgs.
European Patent Office, Communication pursuant to Rule 69 EPC received from the EPO dated Nov. 25, 2013 for related appln. No. 11154275.9, 2 pgs.
Mehari, Yeman, Notice of Allowance received from the USPTO dated Jan. 2, 2014 for related U.S. Appl. No. 13/016,875, 15 pgs.
Meulemans, Bart, Supplementary European Search Report received from the EPO dated Jan. 22, 2014 for related appln. No. E09798318, 6 pgs.
Moon, et al., "Design of a Low-Distortion 22-kHz Fifth-Order Bessel Filter", IEEE Journal of Solid State Circuits, 28 (Dec. 1993), No. 12, New York, US, pp. 1254-1263.
Matsumoto, Yasunori, English Translation of Office Action of Japan Patent Office dated Feb. 4, 2014 for related appln. No. 2012-243547, 2 pgs.
Peregrine Semiconductor Corporation, Response filed in the EPO dated Jan. 8, 2014 for related appln. No. 04816848.8, 13 pgs.
European Patent Office, Communication pursuant to Rules 90(2) and 70a(2) EPC received from EPO dated Feb. 14, 2014 for related appln. No. 09798318.3, 1 pg.
Gundlach, Susanne, Communication under Rule 71(3) EPC received from the EPO dated Feb. 14, 2014 for related appln. No. 04816848.8, 44 pgs.
Sakurada, Masaki, Office Action and English translation of Japanese Office Action received from the JPO dated Mar. 4, 2014 for related appln. No. 2011-171908, 20 pgs.
Le, Dinh Thanh, Notice of Allowance received from the USPTO dated Mar. 12, 2014 for related U.S. Appl. No. 12/460,442, 12 pgs.
Nguyen, Hieu P., Notice of Allowance received from the USPTO dated Mar. 13, 2014 for related U.S. Appl. No. 13/054,781, 19 pgs.
Mehari, Yemane, Notice of Allowance received from the USPTO dated Apr. 14, 2014 for related U.S. Appl. No. 13/016,875, 12 pgs.
Toscano, Oliveros, Communication under Rule 71(3) EPC dated Apr. 25, 2014 for related appln. No. 05763216.8, 47 pgs.
Peregrine Semiconductor Corporation, English translation of Response filed in the JPO filed Apr. 28, 2014 for related appln. No. 2012-243547, 5 pgs.
Tran, Pablo, Office Action received from the USPTO dated May 8, 2014 for related U.S. Appl. No. 14/052,680, 5 pgs.
Peregrine Semiconductor Corporation, Response filed in the EPO dated May 9, 2014 for related appln. No. 11154275.9, 4 pgs.
Hiltunen, Thomas J., Office Action received from the USPTO dated May 22, 2014 for related U.S. Appl. No. 13/933,006, 10 pgs.
Nguyen, Hieu, Notice of Allowance received from the USPTO dated Nov. 13, 2014 for U.S. Appl. No. 13/054,781, 13 pgs.
Tran, Pablo, Office Action received from the USPTO dated Feb. 3, 2012 for related U.S. Appl. No. 12/903,848, 46 pgs.
Fedi, Giulio, Extended Search Report received from the EPO dated Mar. 5, 2012 for related appln. No. 11154277.5, 8 pgs.
Adams, W. J., et al., "OTA Extended Adjustment Range and Linearization Via Programmable Current Mirrors", Circuits and Systems, 1991, Proceedings of the 34th Midwest Symposium on Monterey, CA, USA 14-17 May 14, 1991.
Bogdan Pankiewicz, et al., "A Field Programmable Analog Array for CMOS Continuous-Time OTA-C Filter Applications", IEEE Journal of Solid-State Circuits, IEEE Service Center, vol. 37, No. 2, Feb. 1, 2002.

(56) References Cited

OTHER PUBLICATIONS

Jader, et al., "A Linearly Tunable Low-Voltage CMOS Transconductor with Improved Common-Mode Stability and Its Application to gm-C Filters", IEEE Transactions on Circuits and Systems II: Analog and Digitalsignal Processing, vol. 48, No. 7, Jul. 1, 2001.
Peregrine Semiconductor Corporation, Amendment filed in the EPO dated Mar. 5, 2012 for related appln. No. 11175503.9, 10 pgs.
Ghilini, Marie, Communication under Rule 71(3) EPC received from the EPO dated May 23, 2012 for related appln. No. 11175503.9, 60 pgs.
Wang, Chi-Chang, et al., "Efficiency Improvement in Charge Pump Circuits", IEEE Journal of Solid-State Circuits, vol. 32, No. 6, Jun. 1997, pp. 852-860.
Yamamoto, Kazuya, et al., "A 2.2-V Operation, 2.4-GHz Single-Chip GaAs MMIC Transceiver for Wireless Applications", IEEE Journal of Solid-State Circuits, vol. 34, No. 4, Apr. 1999, pp. 502-512.
Hiramoto, Toshiro, et al., "Low Power and Low Voltage MOSFETs with Variable Threshold Voltage Controlled by Back-Bias", IEICE Trans. Electron, vol. E83-C, No. 2, Feb. 2000, pp. 161-169.
Su, Pin, et al., "On the Body-Source Built-In Potential Lowering of SOI MOSFETs", IEEE Electron Device Letters, vol. 24, No. 2, Feb. 2003, pp. 90-92.
Yang, Min, "Sub-100nm Vertical MOSFET's with Si1-x-y GexCy Source/Drains", a dissertation presented to the faculty of Princeton University, Jun. 2000, 272 pgs.
Ytterdal, T., et al., "MOSFET Device Physics and Operation", Device Modeling for Analog and RF CMOS Circuit Design, 2003 John Wiley & Sons, Ltd., 46 pgs.
Cherne, et al., U.S. Statutory Invention Registration, Registration No. H1435, May 2, 1995.
Ohyama, Hirohito, Translation of an Office Action of Japan Patent Office dated Aug. 7, 2012 for related appln. No. 2010-040443, 1 pg.
Lee, et al., "Analysis of Body Bias Effect with PD-SOI for Analog and RF Application", Solid State Electron, vol. 46, 2002, pp. 1169-1176.
Ippoushi, "SOI Structure Avoids Increases in Chip Area and Parasitic Capacitance Enables Operational Control of Transistor Threshold Voltage", Renesas Edge, vol. 2004.5, Jul. 2004, p. 15.
Hittite Microwave, Floating Ground SPNT MMIC Switch Driver Techniques, 2001.
Caverly, et al., "Gallium Nitride-Based Microwave and RF Control Devices", 2001.
Sedra, et al., "Microelectronic Circuits", University of Toronto, Oxford University Press, Fourth Edition, 1982,1987,1991,1998, pp. 374-375.
Bahl, "Lumped Elements for RF and Microwave Circuits", Artech House, 2003, pp. 353-394.
"Positive Bias GaAs Multi-Throw Switches with Integrated TTL Decoders", Hittite Microwave, 2000.
Peregrine Semiconductor Corporation, Response filed in the EPO dated Oct. 2, 2012 for related appln. No. 11154277.55, 14 pgs.
Tran, Pablo, Notice of Allowance received from the USPTO dated Oct. 26, 2012 for related U.S. Appl. No. 12/903,848, 14 pgs.
Englund, Terry Lee, Office Action received from the USPTO dated Apr. 5, 2011 for related U.S. Appl. No. 12/799,583, 5 pgs.
Burgener, et al., Amendment filed in the USPTO dated Jun. 6, 2011 for related U.S. Appl. No. 12/799,583, 7 pgs.
Englund, Terry Lee, Office Action received from the USPTO dated Aug. 18, 2011 for related U.S. Appl. No. 12/799,583, 47 pgs.
Burgener, et al., Amendment filed in the USPTO dated Feb. 17, 2012 for related U.S. Appl. No. 12/799,583, 24 pgs.
Englund, Terry Lee, Final Office Action received from the USPTO dated Apr. 20, 2012 for related U.S. Appl. No. 12/799,583, 20 pgs.
Burgener, et al., Amendment filed in the USPTO dated Jun. 19, 2012 for related U.S. Appl. No. 12/799,583, 3 pgs.
Englund, Terry Lee, Notice of Allowance received from the USPTO dated Jul. 5, 2012 for related U.S. Appl. No. 12/799,583, 8 pgs.
Englund, Terry Lee, Notice of Allowance received from the USPTO dated Oct. 12, 2012 for related U.S. Appl. No. 12/799,583, 26 pgs.
Burgener, et al., Comments on Examiner's Statement of Reasons for Allowance filed in the USPTO dated Jan. 14, 2013 for related U.S. Appl. No. 12/799,583, 3 pgs.
Maxim Integrated Products, "Charge Pumps Shine in Portable Designs", published Mar. 15, 2001, pp. 1-13.
Nork, Sam, "New Charge Pumps Offer Low Input and Output Noise", Linear Technology Corporation, Design Notes, Design Note 243, Nov. 2000, pp. 1-2.
Linear Technology, "LTC1550I/LTC1551L: Low Noise Charge Pump Inverters in MS8 Shrink Cell Phone Designs", Dec. 1998, pp. 1-2.
Lascari, Lance, "Accurate Phase Noise Prediction in PLL Synthesizers", Applied Microwave & Wireless, May 2000, pp. 90-96.
Texas Instruments, "TPS60204, TPS60205, Regulated 3.3-V, 100-mA Low-Ripple Charge Pump, Low Power DC/DC Converters", Feb. 2001, Revised Sep. 2001, pp. 1-18.
Imbernon, Lisa, Communication from the European Patent office for related appln. No. 048168488, dated Apr. 6, 2009, 2 pages.
Yasuike, Kazuki, English translation of an Office Action of related appln. No. 2006-525525 received from the Japanese atent Office dated Aug. 25, 2009, 3 pgs.
Englund, Terry Lee, Office Action received from related U.S. Appl. No. 10/658,154, dated Dec. 1, 2004, 26 pages.
Burgener, Mark, et al., Amendment filed in USPTO for related U.S. Appl. No. 10/658,154, dated Apr. 1, 2005, 27 pages.
Englund, Terry Lee, Office Action received from related U.S. Appl. No. 10/658,154, dated Aug. 10, 2005, 39 pages.
Burgener, Mark, et al., Amendment After Final filed in USPTO for related U.S. Appl. No. 10/658,154, dated Oct. 11, 2005, 32 pages.
Englund, Terry, Advisory Action received from the USPTO for related U.S. Appl. No. 10/658,154, dated Nov. 2, 2005, 2 pages.
Burgener, Mark, et al., Notice of Appeal filed in USPTO for related U.S. Appl. No. 10/658,154, dated Nov. 10, 2005, 1 page.
Burgener, Mark, et al., Petition for Revival of Appln. and Facts Statement filed in USPTO for related U.S. Appl. No. 10/658,154, dated Jan. 4, 2007, 4 pgs.
Englund, Terry, Not. of Non-Compliant Appeal Brief received from the USPTO for related U.S. Appl. No. 10/658,154, dated Nov. 2, 2006, 7 pages.
Burgener, Mark, et al., Amended Appeal Brief filed in USPTO for related U.S. Appl. No. 10/658,154, dated Jan. 5, 2007, 170 pages.
Burgener, Mark, et al., Pet. to Expedite Previous Petition filed in USPTO for related U.S. Appl. No. 10/658,154, dated Jan. 8, 2007, 6 pgs.
McLaughlin, Kenya, Decision of Petition under 37 CFR 1.137(f) received from USPTO for related U.S. Appl. No. 10/658,154, dated Jan. 31, 2007, 1 page.
McLaughlin, Kenya, Decision Granting received from USPTO for related U.S. Appl. No. 10/658,154, dated Mar. 28, 2007, 1 page.
Englund, Terry, Office Action received from the USPTO for related U.S. Appl. No. 10/658,154, dated May 17, 2007, 52 pages.
Burgener, Mark, et al., Amendment After Re-Opening Prosecution filed in USPTO for related U.S. Appl. No. 10/658,154, dated Sep. 17, 2007, 31 page.
Englund, Terry, Final Office Action received from the USPTO for related U.S. Appl. No. 10/658,154, dated Dec. 12, 2007, 52 pages.
Burgener, Mark, et al., Not. of Appeal, Pre-Appeal Brief Req. and Pre-Appeal Brief Request for Review filed in USPTO for related U.S. Appl. No. 10/658,154, dated May 12, 2008, 7 pages.
Englund, Terry, Not. of Non-Compliant Appeal Brief received from the USPTO for related U.S. Appl. No. 10/658,154, dated Apr. 1, 2009, 2 pages.
Burgener, Mark, et al., Amended Appeal Brief filed in USPTO for related U.S. Appl. No. 10/658,154, dated Jun. 1, 2009, 175 pages.
Englund, Terry, Interview Summary received from the USPTO for related U.S. Appl. No. 10/658,154, dated Oct. 9, 2009, 3 pages.
Burgener, Mark, et al., Stmt. of Substance of Interview filed in USPTO for related U.S. Appl. No. 10/658,154, dated Nov. 9, 2009, 20 pages.
Burgener, Mark, et al., Amendment filed in USPTO for related U.S. Appl. No. 10/658,154, dated Dec. 2, 2009, 19 pages.
Englund, Terry, Notice of Allowance received from the USPTO for related U.S. Appl. No. 10/658,154, dated Jan. 11, 2010, 22 pages.

(56) References Cited

OTHER PUBLICATIONS

Burgener, Mark, et al., Issue Fee Transmittal filed in USPTO for related U.S. Appl. No. 10/658,154, dated Mar. 23, 2010, 1 page.
Tran, Pablo N., Office Action received from the USPTO dated Oct. 29, 2009 for related U.S. Appl. No. 11/501,125, 19 pages.
Ebner von Eschenbach, Jennifer, Communication and Supplementary Search Report received from the EPO dated Nov. 27, 2009 for related appln. No. 05763216.8, 10 pages.
Kai, Tetsuo, Translation of an Office Action received from the Japanese Patent Office dated Mar. 29, 2011 for related Japanese appln. No. 2010-232563, 4 pgs.
Imbernon, Lisa, Communication Pursuant to Article 94(3) EPC received from EPO dated May 18, 2011 for related appln. No. 04816848.8, 5 pgs.
Sircus, Brian, Notification of Transmittal of International Preliminary Report on Patentability dated Aug. 10, 2011 for related application No. PCT/US2009/04149, 17 pgs.
European Patent Office, Invitation pursuant to Rule 63(1) EPC dated Aug. 19, 2011 for related appln. No. 11154275.9, 3 pgs.
Tran, Pablo N., Notice of Allowance received from the USPTO dated Oct. 6, 2011 for related U.S. Appl. No. 11/501,125, 11 pgs.
Kurzbauer, Werner, Extended European Search Report received from the EPO dated Dec. 6, 2011 for related appln. No. 11175503.9, 4 pgs.
Burke, Julie, International Search Report received from the USRO dated Jul. 28, 2005 for related appln. No. PCT/US2004/029166, 11 pgs.
Young, Lee W., International Search Report received from the USRO dated Mar. 14, 2011 for related appln. No. PCT/US2009/04149, 25 pgs.
Kim, et al., Preliminary Amendment filed in the USPTO dated Jan. 18, 2011 for related U.S. Appl. No. 13/054,78, 7 pgs.
Nguyen, Hieu P., Office Action received from the USPTO dated Nov. 14, 2012 for related U.S. Appl. No. 13/054,781, 5 pgs.
Kim, et al., Response filed in the USPTO dated Oct. 11, 2013 for related U.S. Appl. No. 13/054,781, 13 pgs.
Nguyen, Hieu P., Notice of Allowance received from the USPTO dated Jul. 8, 2014 for related U.S. Appl. No. 13/054,781, 61 pgs.
Peregrine Semiconductor Corporation, photocopy of an Article 19 Amendment Under Section 205(b) and Rule 46.5(b) PCT and clean claims for related appln. No. PCT/US2009/004149 dated May 13, 2011, 17 pages.
European Patent Office, photocopy of Communication Pursuant to Rules 161(2) and 162 EPC received from the EPO for related appln. No. 09798318.3 dated May 19, 2011, 2 pgs.
Wells, Kenneth B., Office Action received from the USPTO dated Dec. 26, 2012 for related U.S. Appl. No. 13/105,743, 6 pgs.
Swonger, et al., Response filed in the USPTO dated Jan. 28, 2013 for related U.S. Appl. No. 13/105,743, 7 pg.
Meulemans, Bart, Communication received from the EPO dated Oct. 22, 2013 for related appln. No. 11154275.9, 6 pgs.
Englund, Terry Lee, Office Action received from the USPTO dated Dec. 6, 2013 for related U.S. Appl. No. 13/769,780, 18 pgs.
Peregrine Semiconductor Corporation, Response filed in the EPO on Oct. 10, 2011 for related appln. No. 09798318.3, 3 pgs.
European Patent Office, Communication pursuant to Rules 90(2) and 70a(2) EPC received from the EPO dated Feb. 14, 2014 for related appln. No. 09798318.3, 1 pg.
Peregrine Semiconductor Corporation, Response filed in the EPO on Oct 11, 2011 for related appln. No. 11154275.9 4 pgs.
Peregrine Semiconductor Corporation, Request for Exam and Response filed in the EPO on May 9, 2014 for related appln. No. 1154275.9 4 pgs.
Houston, Adam, Office Action received from the USPTO dated Jun. 26, 2012 for related U.S. Appl. No. 12/913,575, 19 pgs.
Houston, Adam, Notice of Allowance received from the USPTO dated Aug. 27, 2012 for related U.S. Appl. No. 12/913,575, 9 pgs.
Nguyen, Khanh V., Office Action received from the USPTO dated Nov. 4, 2011 for related U.S. Appl. No. 12/807,365, 14 pgs.
Nguyen, Khanh V., Office Action received from the USPTO dated Apr. 5, 2012 for related U.S. Appl. No. 12/807,365, 10 pgs.

Ghilini, Marie, International Search Report and Written Opinion received from the EPO dated Apr. 16, 2012 for related appln. No. PCT/US2011/057381, 11 pgs.
Peregrine Semiconductor Corporation, Demand filed in the EPO dated Aug. 24, 2012 for related appln. No. PCT/US2011/057381, 24 pgs.
Nguyen, Khanh V., Notice of Allowance received from the USPTO dated Sep. 6, 2012 for related U.S. Appl. No. 12/807,365, 13 pgs.
Ratajski, Andre, Written Opinion of the International Preliminary Examining Authority received from the EPO dated Oct. 18, 2012 for related appln. No. PCT/US2011/057381, 6 pgs.
Burgener, et al., Response filed in the USPTO dated Jul. 23 2012 for related U.S. Appl. No. 12/913,575, 7 pgs.
Swonger, James, Preliminary Amendment filed in the USPTO dated Jul. 22, 2011 for related U.S. Appl. No. 13/105,743, 15 pgs.
Imbernon, Lisa, Communication Pursuant to Article 94(3) EPC received from the EPO dated May 18, 2011 for related appln. No. 04816848.8, 5 pgs.
Peregrine Semiconductor Corporation, Response filed in the EPO dated Nov. 28, 2011 for related appln. No. 04816848.8, 18 pgs.
Sircus, Brian, International Preliminary Report on Patentability received from the USRO dated Aug. 10, 2011 for related appln. No. PCT/US2009/004149, 17 pgs.
Kurzbauer, Werner, Communication under Rule 71(3) EPC received from the EPO dated May 23, 2012 for related appln. No. 11175503.9-2215, 60 pgs.
Le, Dinh Thanh, Notice of Allowance received from the USPTO dated Nov. 7, 2013 for related U.S. Appl. No. 12/460,422, 16 pgs.
Wells, Kenneth, Notice of Allowance received from the USPTO dated Jul. 24, 2013 for related U.S. Appl. No. 13/105,743, 10 pgs.
Burgener, et al., Response filed in the USPTO dated Jun. 3, 2014 for related U.S. Appl. No. 13/796,780, 17 pgs.
Peregrine Semiconductor Corporation, Response and English translation filed in the Japanese Patent Office dated Jun. 3, 2014 for related appln. No. 2011-171908, 21 pgs.
Kim, et al., Comments on Examiner's Statement of Reasons for Allowance filed in the USPTO dated Jul. 14, 2014 for related U.S. Appl. No. 13/016,875, 3 pgs.
European Patent Office, Decision to Grant a European Patent Pursuant to Article 97(1) EPC dated Jul. 3, 2014 for related appln. No. 04816848.8, 2 pgs.
Le, Dinh Thanh, Notice of Allowance received from the USPTO dated Jul. 8, 2014 for related U.S. Appl. No. 12/460,442, 15 pgs.
Peregrine Semiconductor Corporation, Response filed in the USPTO dated Aug. 19, 2014 for related appln. No. 09798318.3, 20 pgs.
Moon, et al., "TA 7.1: A Low-Distortion 22kHz 5th-Order Bessel Filter*", ISSCC 93/Session 7/Analog Techniques/ Paper TA 7.1, 1993 IEEE International Solid-State Circuits Conference, pp. 110-111 and 271.
Englund, Terry Lee, Office Action received from the USPTO dated May 23, 2014 for U.S. Appl. No. 13/932,996, 13 pgs.
Englekirk, Robert Mark, Response filed in the USPTO dated Aug. 25, 2014 for U.S. Appl. No. 13/932,996, 14 pgs.
Englund, Terry Lee, Final Office Action received from the USPTO dated Sep. 18, 2014 for U.S. Appl. No. 13/769,780, 25 pgs.
European Patent Office, Invitation to Remedy Deficiencies dated Oct. 1, 2014 for appln. No. 14178741.6, 1 pg.
Wells, Kenneth B., Office Action received from the USPTO dated Oct. 20, 2014 for U.S. Appl. No. 14/230,945, 5 pgs.
Imbernon, Lisa, Extended Search Report received from the EPO dated Jan. 8, 2015 for appln. No. 14178741.6, 6 pgs.
Matsumoto, Yasunori, English translation of Final Office Action received from the JPO dated Feb. 10. 2015 for appln. No. 2012-243547, 2 pgs.
Swonger, James, Response filed in the USPTO dated Dec. 18, 2014 for U.S. Appl. No. 14/230,945, 6 pgs.
Burgener, et al., Response After Final Office Action filed in the USPTO dated Dec. 18, 2014 for U.S. Appl. No. 13/769,780, 21 pgs.
Englund, Terry Lee, Advisory Action received from the USPTO dated Jan. 6, 2015 for U.S. Appl. No. 13/769,780, 12 pgs.
Englund, Terry Lee, Final Office Action received from the USPTO dated Jan. 20, 2015 for U.S. Appl. No. 13/932,996, 65 pgs.

(56) References Cited

OTHER PUBLICATIONS

Wells, Kenneth B., Office Action received from the USPTO dated Jan. 20, 2015 for U.S. Appl. No. 14/230,945, 13 pgs.
Kim, et al., Comments on Examiner's Statement of Reasons for Allowance filed in the USPTO dated Feb. 13, 2015 for U.S. Appl. No. 13/054,781, 3 pgs.
Le, Dinh Thanh, Notice of Allowance received from the USPTO dated Jan. 2, 2015 for U.S. Appl. No. 12/460,442, 23 pgs.
Englekirk, Robert Mark, Response to Final Pre-RCE Office Action filed in the USPTO dated Mar. 20, 2015 for U.S. Appl. No. 13/932,996, 14 pgs.
Swonger, James, Amendment filed in the USPTO dated Apr. 20, 2015 for U.S. Appl. No. 14/230,945, 9 pgs.
Wells, Kenneth B, Notice of Allowance received from the USPTO dated May 4, 2015 for U.S. Appl. No. 13/769,780, 28 pgs.
Wells, Kenneth B., Final Office Action received from the USPTO dated May 6, 2015 for U.S. Appl. No. 14/230,945, 13 pgs.
Peregrine Semiconductor Corporation, Translation of Response filed in the JPO on May 12, 2015 for appln. No. 2012-243547, 4 pgs.
Swonger, James, Amendment filed in the USPTO dated Jul. 16, 2015 for U.S. Appl. No. 14/230,945, 10 pgs.
Peregrine Semiconductor Corporation, Response filed in the EPO dated Jul. 14, 2015 for appln. No. 14178741.6, 9 pgs.
Wells, Kenneth, Advisory Action received from the USPTO dated Jul. 15, 2015 for U.S. Appl. No. 14/230,945, 4 pgs.
Skibinski, Thomas, Office Action received from the USPTO dated Jul. 27, 2015 for U.S. Appl. No. 13/932,996, 43 pgs.
Wells, Kenneth, Notice of Allowance received from the USPTO dated Sep. 4, 2015 for U.S. Appl. No. 13/769,780, 9 pgs.
Wells, Kenneth, Office Action received from the USPTO dated Sep. 4, 2015 for U.S. Appl. No. 14/230,945, 79 pgs.
Englekirk, Robert Mark, Response tiled in the USPTO dated Oct. 27, 2015 for U.S. Appl. No. 13/932,996, 12 pg.
Skibinski, Thomas S., Final Office Action received from the USPTO dated Nov. 9, 2015 for U.S. Appl. No. 13/932,996, 31 pgs.
Swonger, James W., Amendment filed in the USPTO dated Dec. 1, 2015 for U.S. Appl. No. 14/230,945, 8 pgs.
Nguyen, Hieu P., Office Action received from the USPTO dated Dec. 30, 2015 for U.S. Appl. No. 14/638,954, 6 pgs.

\* cited by examiner

VARIABLE FREQUENCY CHARGE PUMP

CROSS-REFERENCE TO RELATED APPLICATIONS

The present application is related to the following commonly assigned issued patents: U.S. Pat. No. 7,719,343 issued May 18, 2010 entitled "Low Noise Charge Pump Method and Apparatus" Ser. No. 10/658,154; identically entitled U.S. Pat. No. 8,378,736 issued Feb. 19, 2013; pending U.S. patent application Ser. No. 13/054,781 filed Jan. 18, 2011, entitled "Low-Noise High Efficiency Bias Generation Circuits and Method"; U.S. Pat. No. 8,373,490 issued Feb. 12, 2013 entitled "Method, System and Apparatus for RF and DC Switching"; U.S. patent application Ser. No. 13/105,743 filed May 11, 2011, entitled "High Voltage Ring Pump" now issued as U.S. Pat. No. 8,686,787 on Apr. 1, 2014; and pending U.S. patent application Ser. No. 13/016,875 filed Jan. 28, 2011, entitled "Low-Noise High Efficiency Bias Generation Circuits and Method".

BACKGROUND (1) Technical Field

This invention generally relates to electronic power supplies, and more specifically to capacitive energy transfer DC-to-DC converters (DC/DC converters), such as charge pumps.

(2) Background

DC/DC converter power supply circuits provide a DC output voltage based upon a DC source voltage, where the output voltage is typically different than the input voltage. As the term is used herein, DC/DC converters do not encompass voltage reduction regulator circuits that use a linear pass device, but rather involve energy transfer from input to output through an energy storage device, such as a capacitor or an inductor.

A type of DC/DC converter is a "charge pump", which obtains energy for the output voltage primarily by means of capacitive transfer from the source to the output. An inductor is not generally the primary energy transfer device in a charge pump, though of course hybrid devices are possible that employ inductive energy transfer in addition to capacitive energy transfer. A charge pump may derive an output voltage that is higher than a source voltage, or that is inverted from a source voltage, or that is referenced to a different voltage than the source voltage, and may do all of these things concurrently. Energy transfer capacitors used in charge pumps are typically known as "fly capacitors" or "fly caps".

Charge pumps may be implemented for a wide variety of purposes. They are well suited for integrated circuit fabrication because the devices and elements required are compatible with most integrated circuit fabrication techniques. For example, a charge pump may be employed to generate a negative gate bias supply for an integrated circuit that switches an antenna between send and receive circuitry of a transceiver, as shown in FIG. 1. Many wireless transceivers, such as cellular telephones, employ a single antenna for both receiving and transmitting. While such systems are receiving, an antenna 102 must be coupled to receive circuitry 103 that may include, for example, a filter 104 and a low noise amplifier 106, to provide the received signal for further processing. However, while such systems are transmitting, the antenna 102 must be disconnected from the sensitive receive circuitry 103 and coupled instead to relatively high power transmit circuitry 107. The transmit circuitry 107 may further include, for example, a power amplifier 108 and a transmit filter 110 to process a transmit signal. Note that the circuit shown in FIG. 1 is schematically simple for ease of understanding; in an actual implementation, there are often multiple transmit and receive circuits, and transmission and reception may be occurring on the same path at the same time.

An RF switch 112 may be used to perform such antenna switching functions, as well as RF switching functions in general. Ideally, such switches may be integrated together with the receive and/or transmit circuitry, and in any event are desirably very small, due to integrated circuit die cost and space limitations in portable transceivers such as mobile telephones and handy talkies. In order to achieve good performance from switching devices, such as FETs, used to implement such RF switches, many designs need a special bias supply that extends negatively below the supply rails of the transmit and receive circuitry, such as a −3V supply. In view of the space and cost constraints of transceiver units such as mobile telephones, a charge pump is particularly suitable for generating such a bias supply, because it can be readily integrated into a very small circuit.

The RF switch 112 conveys relatively high power signals to the antenna 102 during transmission. However, during receive, the signal passed by the RF switch 112 may be measured in tens of nanovolts. Sharp noise transitions may have an extremely broad frequency content, and thus even signals at amplitudes on the order of millivolts may interfere unacceptably with reception if the signals have extremely fast edges. While the filter 104 can remove some noise, it is important that the RF switch 112 not introduce noise, particularly noise having components near the center frequency of the received signal. Thus, the receive/transmit switch of FIG. 1 illustrates one of many circumstances in which a charge pump may be desired for a circuit that nonetheless requires extremely low noise.

Unfortunately, noise generation is one of the most common drawbacks of charge pumps. Current spikes are typically coupled into both input and output supplies, together with voltage ripples and spikes. When a charge pump is integrated together with other devices, such electronic noise may be coupled throughout the circuitry of the integrated device by a variety of mechanisms that are difficult to control.

Charge pump power supplies can also be weak (i.e., not able to drive large load currents), although a designer may trade drive strength for noise. In some applications (generally FET based designs), loading events primarily occur during state or mode changes for the part. During this time, the noise generated by the charge pump circuitry is not a critical factor. As such, a designer may desire some way to switch between a mode that is strong, and one that is quiet. Charge pumps typically require the use of some form of clock, whether externally provided or internally generated. A higher clock rate will make for a stronger charge pump, but this may also introduce more noise. Also, higher frequency noise terms may tend to couple more easily into undesired places or bands. In particular, the frequency of the charge pump clock can show up as a distinct "spur" signals (spurs) both at multiples of itself in baseband and/or at multiples of itself offset from whatever RF frequency is being utilized by the system. In the case of a switch with both transmit and receive signals present in different bands, it is possible for clock spurs offset from the transmit band to show up in the receive band.

It is known to use two clock frequencies, high and low, in a charge pump circuit to switch between a strong, noisy mode and a weak, less noisy mode. However, in such designs, the clock frequency is only high for a fixed period of time starting at the beginning of a state change. Due to process variation and unknown loading conditions, this two-state clock may either turn off too soon, resulting in poor settling time, or too late, resulting in noise being present during a desired "quiet" period.

Thus, a need exists for charge pumps that avoid generating excessive noise, so as to reduce charge pump noise injection into source supplies, output supplies, and related circuits.

The method and apparatus presented below address this need for a low-noise charge pump. Various aspects of the method and apparatus described below will be seen to provide further advantages, as well, for the design and construction of charge pumps that are relatively free of noise spurs.

SUMMARY OF THE INVENTION

A charge pump method and apparatus for DC-to-DC conversion is set forth by which an output is generated in a charge pump circuit by alternately coupling a transfer capacitor to an input supply and then to the output. A variable rate charge pump clock output is generated to control the charge pump circuit. The charge pump method and apparatus further includes a combination of one or more aspects of the method and apparatus, as set forth below, in order to reduce noise or otherwise improve the design.

More particularly, the invention includes a charge pump circuit that utilizes a sensing circuit for determining the current loading or status of the output supply generated by the charge pump circuit to determine a corresponding frequency for a variable rate clock for the charge pump circuit. When a load is present, the clock frequency automatically ramps up to a relatively high level to increase the output current of the charge pump circuit. When the load is removed and the supply is settled out, the clock frequency is automatically reduced to a relatively quieter level. Accordingly, the charge pump circuit is only noisy when it has to be, thus providing optimal power when required and being electrically quiet at all other times.

A further aspect of the invention is to add some randomization to the clock signal to the charge pump(s) in order to spread generated output spurs. An optional noise source may be added to the bias signal to a clock source for a charge pump to add some variability to the clock signal.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

A charge pump method and apparatus for DC-to-DC conversion is set forth by which an output is generated in a charge pump circuit by alternately coupling a transfer capacitor to an input supply and then to the output. A variable rate charge pump clock output is generated to control the charge pump circuit. The charge pump method and apparatus further includes a combination of one or more aspects of the method and apparatus, as set forth below, in order to reduce noise, reduce supply current, or otherwise improve the design.

More particularly, the invention includes a charge pump circuit that utilizes a sensing circuit for determining the current loading or status of the output supply generated by the charge pump circuit to determine a corresponding frequency for a variable rate clock for the charge pump circuit. When a load is present (typically during state changes), the clock frequency automatically ramps up to a relatively high level to increase the output current of the charge pump circuit. When the load is removed and the supply is settled out, the clock frequency is automatically reduced to a relatively quieter level. Accordingly, the charge pump circuit is only noisy when it has to be, thus providing optimal power when required and being electrically quiet at all other times. In addition, when the clock frequency is at a reduced level, the charge pump circuitry operates at a lower power level, which is particularly useful for battery powered systems.

Figure 1:
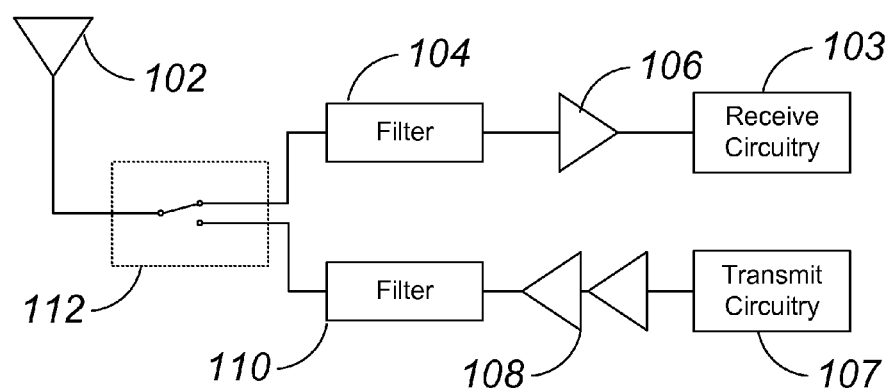
FIG. 1 is a circuit diagram of a prior art integrated circuit that switches an antenna between send and receive circuitry of a transceiver.
Figure 2:
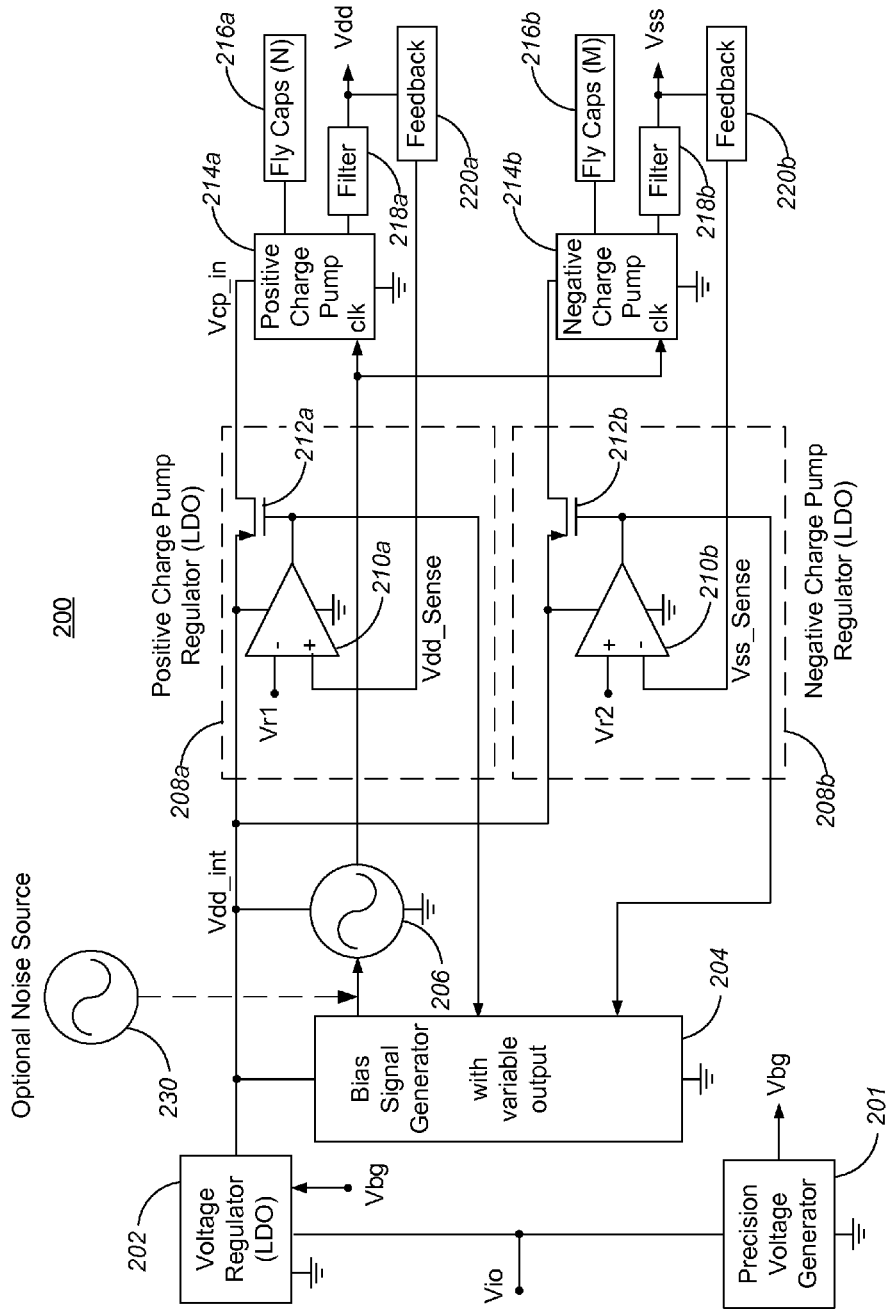
FIG. 2 is a circuit diagram of one embodiment of a variable frequency charge pump in accordance with the invention.

FIG. 2 is a circuit diagram of one embodiment 200 of a variable frequency charge pump in accordance with the invention. A precision voltage generator 201 provides a DC reference voltage Vbg from an input DC voltage Vio which may vary over some range. In the illustrated embodiment, Vio may range, for example, from 1.6V to 3.6V. While a number of circuits may be used to implement the precision voltage generator 201, one circuit that may be used is a bandgap voltage reference circuit. A bandgap voltage reference circuit is a temperature independent voltage reference circuit widely used in integrated circuits.

In the illustrated embodiment, a voltage regulator 202 clamps the input voltage Vio to a stable steady DC voltage Vdd_int. The voltage regulator 202 may be implemented as a low-dropout (LDO) regulator, a version of which is described in greater detail below. The reference voltage Vbg may be used to provide a suitable reference voltage for the voltage regulator 202 and other parts of the circuit as needed.

In the illustrated embodiment, the output voltage Vdd_int from the voltage regulator 202 is coupled to a bias signal generator 204, a clock source 206, and both a positive charge pump regulator 208a and a negative charge pump regulator 208b. The bias signal generator 204 provides a variable output bias signal in response to one or more inputs (e.g., a current input or a voltage input), and may be implemented in any number of known ways. The output bias signal from the bias signal generator 204 determines the output frequency of the clock source 206. The clock source 206 may be, for example, a voltage or current controlled oscillator.

A positive charge pump regulator 208a is shown implemented as a low-dropout (LDO) regulator, which is a DC linear voltage regulator which can operate with a very small input-output differential voltage. The advantages of an LDO voltage regulator include a low minimum operating voltage, high efficiency operation, and low heat dissipation. The main components of the LDO are a differential amplifier (error amplifier) 210a and a power FET 212a.

The output of the differential amplifier 210a controls (gates) the conductivity of the power FET 212a, thus regulating the voltage level applied to the input of a positive charge pump 214a. One input of the differential amplifier 210a is a precision reference voltage Vr1 (which may be, for example, Vbg). The other input (Vdd_Sense) of the differential amplifier 210a is a fraction of the output voltage (Vdd) of the positive charge pump 214a, where Vdd_Sense is determined by a feedback circuit 220a. As one example, the feedback circuit 220 may be implemented as a resistive divider coupled between ground and Vdd, such that if the output voltage Vdd rises, Vdd_Sense will rise proportionately. If Vdd_Sense deviates too high or too low relative to the reference voltage Vr1, the output of the differential amplifier 210a causes the conductivity of power FET 212a to change to maintain a proper voltage input to the positive charge pump 214a such that the voltage output Vdd of the positive charge pump 214a is constant.

The positive charge pump 214a may be implemented in a number of known ways. A suitable charge pump circuit is taught in U.S. Pat. No. 7,719,343, issued May 18, 2010 and assigned to the assignee of the present invention. A charge pump typically has an input voltage supply (e.g., Vcp_in), a voltage supply output (e.g., Vdd), and some form of clock signal input (discussed below). In general, charge pump based DC-to-DC conversion is accomplished by alternately coupling a transfer or "fly" capacitor to the input voltage supply and then to the voltage supply output. The frequency of the clock signal input to a charge pump affects the noise level and current supply capability of the charge pump.

A charge pump has to be able to supply the minimum required output voltage under load that is required by the system, given the minimum possible value of Vio (and thus of Vdd_int, and thus finally to the charge pump supply input, Vcp_in). For example, if the desired output from the positive charge pump 214a is +3.4V, and the minimum Vio is +1.6V, the positive charge pump 214a must be able to at least more than double the input voltage Vio.

The positive charge pump 214a is coupled to a set of fly caps 216a (shown as N in this example) as energy transfer devices. The number N for the set of fly caps 216a is determined based on the design criteria for a particular charge pump circuit and application, as is known in the art.

The voltage output of the positive charge pump 214a is typically applied to a suitable filter circuit 218a to provide a reasonably smooth output voltage, Vdd. For example, the filter circuit 218a may be implemented as a combination of one or more resistors, capacitors, and inductors. Note also that while the feedback circuit 220a is preferably coupled after the filter circuit 218a, in some implementations the feedback circuit 220a may be coupled before the filter circuit 218a.

The positive charge pump 214a is coupled to the clock source 206, which provides a clock signal to the positive charge pump 214a. As noted above, the frequency of the clock signal affects the noise level and current supply capability of the positive charge pump 214a.

Note that while the positive charge pump regulator 208a is shown as coupled before the positive charge pump 214a, it may instead be coupled after the positive charge pump 214a (i.e., pre-regulation versus post-regulation). It addition, it is possible to implement the design without any charge pump regulator, and essentially control the output voltage (drive capability) of the positive charge pump 214a by the clock signal frequency alone, assuming there is some form of load. It may be useful to retain some form of differential or operational amplifier to drive the bias signal generator 204, thus in essence just deleting the power FET 212a.

In the illustrated embodiment of the present invention, the input Vdd_Sense to the differential amplifier 210a essentially follows, or monitors, the output Vdd of the positive charge pump 214a. The output voltage Vdd will vary with load, tending to decrease as load increases. Accordingly, the output of the differential amplifier 210a essentially reflects the current draw, or load, on the positive charge pump 214a. By applying the output of the differential amplifier 210a to the bias signal generator 204, the bias signal to the clock source 206 varies with the monitored load at the output Vdd of the positive charge pump 214a, thus varying the clock signal to the positive charge pump 214a as a function of load. Accordingly, as the monitored load increases, Vdd begins to slump, Vdd_Sense decreases, the output of the differential amplifier 210a decreases, the bias signal from the bias signal generator 204 to the clock source 206 increases, the frequency of the clock signal increases, and the positive charge pump 214a increases its output current to supply the increased load. However, as the load decreases, this feedback loop causes the frequency of the clock signal to decrease, and the positive charge pump 214a decreases its output current in response to the decreased load, resulting in significantly less noise from the positive charge pump 214a.

It should be appreciated that while the illustrated embodiment uses the output of the differential amplifier 210a as a way of providing feedback to the bias signal generator 204, other ways of accomplishing the same function will be readily apparent to one of ordinary skill in the art. For example, the feedback circuit 220a may be implemented to sense voltage changes or current indicative of the current load at the output of the positive charge pump 214a, and directly provide a control signal to the bias signal generator 204 for altering the bias signal to the clock source 206 and hence changing the frequency of the clock signal to adjust to changes in the current load.

FIG. 2 also shows a negative charge pump regulator 208b, a feedback circuit 220b, and associated charge pump circuitry 214b-218b. Each of the positive charge pump regulator 208a and the negative charge pump regulator 208b and their associated circuitry shown in FIG. 2 operate in similar fashion, differing principally in the sign (polarity) of their respective output voltages. Accordingly, the description above of the positive charge pump regulator 208a, feedback circuit 220a, and associated charge pump circuitry 214a-218a applies to the negative charge pump regulator 208b, feedback circuit 220b, and associated charge pump circuitry 214b-218b, with the appropriate polarity differences and a suitable reference voltage Vr2 for the negative charge pump regulator 208b. One structural difference in implementing the negative charge pump 214b is that the number of fly capacitors 216b (shown as M in this example) is typically greater than for the positive charge pump 214a (shown as N in this example) to achieve the same output voltage level (with polarity reversed), in order to offset the initial positive voltage input Vdd_int. It should also be noted that only one of the two charge pump circuit sections need be present, for downstream circuits that only require an increased positive voltage supply or a negative voltage supply.

Note that in FIG. 2, additional filtering capacitors, typically present on each input and output supply, are omitted to avoid confusion with the energy transfer fly capacitors 216a, 216b. In addition, while one bias signal generator 204 and clock source 206 is shown coupled to both the positive charge pump 214a and the negative charge pump 214b, instead separate bias signal generators and clock sources can be coupled to each charge pump so that the frequency of the clock signal to each charge pump is independently determined by the load on such charge pump.

A further aspect of the invention is to add some randomization to the frequency of the clock signal to the charge pump(s) in order to spread generated output spur signals (spurs). A fixed clock frequency leads to a fixed tone or spur that is coupled into the RF path. If one were to quantify the spurious free dynamic range (SFDR), a fixed frequency (tone) has a higher peak than a variable frequency clock. The variable frequency has its power distributed across a range of frequencies, thus reducing the peak power that might be coupled into the RF path. Referring to FIG. 2, an optional noise source 230 may be added to the bias signal of the clock source 206 to add some variability to the frequency of the clock signal. The amount of bias signal variation would depend on the specifics of a particular system design, and depends, among other things, on how much frequency spreading is required for a specified SFDR and how bad spurious coupling happens to be for a particular product or application.

It will be appreciated that the circuits described above may be implemented with a variety of circuit parameters, including but not limited to voltage values, and that one of ordinary skill in the art would select such parameters based on a particular application and implementation technology. As one example, the various voltage regulators 202, 208a, 208b do not have to be an LDO type, but may be any other desired type that meets a particular implementation specification and technology, such as a depletion mode source follower output or the like.

Accordingly, aspects of the invention include monitoring the voltage output or current load of a frequency driven charge pump circuit, and dynamically adjusting the input frequency of the charge pump circuit in response to changes to the voltage output or current load. Doing so avoids generating excessive noise from the charge pump circuit, thereby reducing charge pump noise injection into source supplies, output supplies, and related circuits. Thus, the charge pump circuit is only noisy when it has to be while providing optimal power when required and being electrically quiet and operating at lower power at all other times.

A number of embodiments of the invention have been described. It is to be understood that various modifications may be made without departing from the spirit and scope of the invention. For example, some of the steps described above may be order independent, and thus can be performed in an order different from that described. It is to be understood that the foregoing description is intended to illustrate and not to limit the scope of the invention, which is defined by the scope of the following claims, and that other embodiments are within the scope of the claims.

What is claimed is:

1. A variable frequency charge pump circuit generating reduced electrical noise at low loads, including:
    (a) a charge pump having a clock signal input, a voltage supply input, and an output, for providing a pumped output voltage at the output based on a regulated input voltage applied at the voltage supply input, with a current available to a load coupled to the output being a function of the frequency of a signal applied to the clock signal input;
    (b) a feedback circuit coupled to the charge pump output for providing a feedback signal indicative of the pumped output voltage at such output;
    (c) a voltage regulator coupled to a voltage source, the charge pump voltage supply input, and the feedback circuit, for providing the regulated input voltage to the charge pump voltage supply input in response to the feedback signal, thereby regulating the pumped output voltage at the charge pump output, the voltage regulator including:
        (1) a controllable conductivity device coupled to the voltage source and to the charge pump voltage supply input, and having a control input for controlling the conductivity of the controllable conductivity device; and
        (2) an amplifier having an output coupled to the control input of the controllable conductivity device, a first input coupled to a reference voltage, and a second input coupled to the feedback circuit, for generating a control signal at the amplifier output that varies as a function of a difference between the feedback signal and the reference voltage, the control signal controlling the conductivity of the controllable conductivity device and thus the input voltage applied to the charge pump voltage supply input;
    (d) a clock source having a voltage input coupled to the voltage source, a control input configured to receive a bias signal generated from the feedback signal, and a clock signal output coupled to the charge pump clock signal input, for generating a clock signal at the clock signal output coupled to the charge pump clock signal input, the clock signal having a frequency that is a function of the feedback signal through the bias signal, thereby controlling the amount of current available to the load coupled to the charge pump output as function of the frequency of the clock signal, whereby as the load increases, the frequency of the clock signal increases and the current available from the charge pump increases, and as the load decreases, the frequency of the clock signal decreases and the current available from the charge pump decreases with a resulting decrease in electrical noise generated by the charge pump.

2. The variable frequency charge pump circuit of claim 1, further including a bias signal generator, coupled to the output of the amplifier and to the control input of the clock source, for providing the bias signal to the clock source as a function of the feedback signal.

3. The variable frequency charge pump circuit of claim 1, wherein the controllable conductivity device is a field effect transistor.

4. The variable frequency charge pump circuit of claim 1, further including a noise source coupled to the clock source for varying the frequency of the clock signal from the clock source in order to spread generated spur signals.

5. A variable frequency charge pump generating reduced electrical noise at low loads, including:
    (a) charge pump means for providing a pumped output voltage at an output based on a regulated input voltage applied at a voltage supply input, with a current available to a load coupled to the output being a function of the frequency of a signal applied to a clock signal;
    (b) feedback circuit means coupled to the output of the charge pump means, for providing a feedback signal indicative of the pumped output voltage at such output;
    (c) voltage regulator means coupled to a voltage source, the voltage supply input of the charge pump means, and the feedback circuit means, for providing the regulated input voltage to the voltage supply input of the charge pump means in response to the feedback signal, thereby regulating the pumped output voltage at the output of the charge pump means, the voltage regulator means including:
        (1) a controllable conductivity device coupled to the voltage source and to the voltage supply input of the charge pump means, and having a control input for controlling the conductivity of the controllable conductivity device; and
        (2) an amplifier having an output coupled to the control input of the controllable conductivity device, a first input coupled to a reference voltage, and a second input coupled to the feedback circuit means, for generating a control signal at the amplifier output that varies as a function of a difference between the feedback signal and the reference voltage, the control signal controlling the conductivity of the controllable conductivity device and thus the input voltage applied to the voltage supply input of the charge pump means;

(d) clock source means having a voltage input coupled to the voltage source, a control input configured to receive a bias signal generated from the feedback signal, and a clock signal output coupled to the clock signal input of the charge pump means, for generating a clock signal at the clock signal output coupled to the clock signal input of the charge pump means, the clock signal having a frequency that is a function of the feedback signal through the bias signal, thereby controlling the amount of current available to the load coupled to the output of the charge pump means as a function of the frequency of the clock signal, whereby as the load increases, the frequency of the clock signal increases and the current available from the charge pump means increases, and as the load decreases, the frequency of the clock signal decreases and the current available from the charge pump means decreases with a resulting decrease in electrical noise generated by the charge pump means.

6. The variable frequency charge pump of claim 5, further including a bias signal generator means, coupled to the output of the amplifier and to the control input of the clock source means, for providing the bias signal to the clock source means as a function of the feedback signal.

7. The variable frequency charge pump circuit of claim 5, wherein the controllable conductivity device is a field effect transistor.

8. The variable frequency charge pump circuit of claim 5, further including a noise source means coupled to the clock source means for varying the frequency of the clock signal from the clock source means in order to spread generated spur signals.

9. A method for controlling a charge pump circuit so as to reduce electrical noise at low loads, including the steps of:
(a) providing a pumped output voltage at an output of a charge pump based on a regulated input voltage applied at a voltage supply input to the charge pump, with a current available to a load coupled to the output being a function of the frequency of a signal applied to a clock signal input to the charge pump;
(b) generating a feedback signal indicative of the pumped output voltage at the output of the charge pump;
(c) providing the regulated input voltage to the voltage supply input of the pump charge in response to the feedback signal, thereby regulating the pumped output voltage at the output of the pump charge, including:
 (1) coupling a controllable conductivity device to a voltage source and to the voltage supply input of the pump charge, the controllable conductivity device having a control input for controlling the conductivity of the controllable conductivity device; and
 (2) coupling an output of an amplifier to the control input of the controllable conductivity device, coupling a first input of the amplifier to a reference voltage, and coupling a second input of the amplifier to the feedback signal; and
 (3) generating a control signal at the amplifier output that varies as a function of a difference between the feedback signal and the reference voltage, the control signal controlling the conductivity of the controllable conductivity device and thus the input voltage applied to the voltage supply input of the pump charge;
(d) generating a clock signal from a clock source means having a voltage input coupled to the voltage source, a control input configured to receive a bias signal generated from the feedback signal, and a clock signal output coupled to the clock signal input of the charge pump, the clock signal having a frequency that is a function of the feedback signal through the bias signal, thereby controlling the amount of current available to the load coupled to the output of the charge pump as a function of the frequency of the clock signal, whereby as the load increases, the frequency of the clock signal increases and the current available from the charge pump increases, and as the load decreases, the frequency of the clock signal decreases and the current available from the charge pump decreases with a resulting decrease in electrical noise generated by the charge pump.

10. The method of claim 9, further including the step of randomly varying the frequency of the clock signal in order to spread generated spur signals.

11. A variable frequency charge pump circuit generating reduced electrical noise at low loads, including:
(a) a charge pump having a clock signal input, a voltage input, and an output, for providing a pumped output voltage at the output based on an input voltage applied at the voltage input, with a current available to a load coupled to the output being a function of the frequency of a signal applied to the clock signal input;
(b) a feedback circuit coupled to the charge pump output for providing a feedback signal indicative of the pumped output voltage at such output;
(c) a voltage regulator coupled to a voltage source, the charge pump voltage input, and the feedback circuit, for regulating the input voltage applied to the charge pump voltage input in response to the feedback signal, thereby regulating the pumped output voltage at the charge pump output, the voltage regulator including:
 (1) a controllable conductivity device coupled to the voltage source and to the charge pump voltage input, and having a control input for controlling the conductivity of the controllable conductivity device; and
 (2) an amplifier having an output coupled to the control input of the controllable conductivity device, a first input coupled to a reference voltage, and a second input coupled to the feedback circuit, for generating a control signal at the amplifier output that varies as a function of a difference between the feedback signal and the reference voltage, the control signal controlling the conductivity of the controllable conductivity device and thus the input voltage applied to the charge pump voltage input;
(d) a clock source having a voltage input coupled to the voltage source, a control input configured to receive a bias signal generated from the feedback signal, and a clock signal output coupled to the charge pump clock signal input, for generating a clock signal at the clock signal output coupled to the charge pump clock signal input, the clock signal having a frequency that is a function of the feedback signal through the bias signal, thereby controlling the amount of current available to the load coupled to the charge pump output as function of the frequency of the clock signal, whereby as the load increases, the frequency of the clock signal increases and the current available from the charge pump increases, and as the load decreases, the frequency of the clock signal decreases and the current available from the charge pump decreases with a resulting decrease in electrical noise generated by the charge pump; and
(e) a bias signal generator, coupled to the output of the amplifier and to the control input of the clock source, for providing the bias signal to the clock source as a function of the feedback signal.

12. The variable frequency charge pump circuit of claim 11, wherein the controllable conductivity device is a field effect transistor.

13. The variable frequency charge pump circuit of claim 11, further including a noise source coupled to the clock source for varying the frequency of the clock signal from the clock source in order to spread generated spur signals.

14. A variable frequency charge pump generating reduced electrical noise at low loads, including:
  (a) charge pump means for providing a pumped output voltage at an output based on an input voltage applied at a voltage input, with a current available to a load coupled to the output being a function of the frequency of a signal applied to a clock signal;
  (b) feedback circuit means coupled to the output of the charge pump means, for providing a feedback signal indicative of the pumped output voltage at such output;
  (c) voltage regulator means coupled to a voltage source, the voltage input of the charge pump means, and the feedback circuit means, for regulating the input voltage applied to the voltage input of the charge pump means in response to the feedback signal, thereby regulating the pumped output voltage at the output of the charge pump means, the voltage regulator means including:
    (1) a controllable conductivity device coupled to the voltage source and to the voltage input of the charge pump means, and having a control input for controlling the conductivity of the controllable conductivity device; and
    (2) an amplifier having an output coupled to the control input of the controllable conductivity device, a first input coupled to a reference voltage, and a second input coupled to the feedback circuit means, for generating a control signal at the amplifier output that varies as a function of a difference between the feedback signal and the reference voltage, the control signal controlling the conductivity of the controllable conductivity device and thus the input voltage applied to the voltage input of the charge pump means;
  (d) clock source means having a voltage input coupled to the voltage source, a control input configured to receive a bias signal generated from the feedback signal, and a clock signal output coupled to the clock signal input of the charge pump means, for generating a clock signal at the clock signal output coupled to the clock signal input of the charge pump means, the clock signal having a frequency that is a function of the feedback signal through the bias signal, thereby controlling the amount of current available to the load coupled to the output of the charge pump means as a function of the frequency of the clock signal, whereby as the load increases, the frequency of the clock signal increases and the current available from the charge pump means increases, and as the load decreases, the frequency of the clock signal decreases and the current available from the charge pump means decreases with a resulting decrease in electrical noise generated by the charge pump means; and
  (e) a bias signal generator, coupled to the output of the amplifier and to the control input of the clock source, for providing the bias signal to the clock source as a function of the feedback signal.

15. The variable frequency charge pump circuit of claim 14, wherein the controllable conductivity device is a field effect transistor.

16. The variable frequency charge pump circuit of claim 14, further including a noise source means coupled to the clock source means for varying the frequency of the clock signal from the clock source means in order to spread generated spur signals.

17. A method for controlling a charge pump circuit so as to reduce electrical noise at low loads, including the steps of:
  (a) providing a pumped output voltage at an output of a charge pump based on an input voltage applied at a voltage input to the charge pump, with a current available to a load coupled to the output being a function of the frequency of a signal applied to a clock signal input to the charge pump;
  (b) generating a feedback signal indicative of the pumped output voltage at the output of the charge pump;
  (c) regulating the input voltage applied to the voltage input of the pump charge in response to the feedback signal, thereby regulating the pumped output voltage at the output of the pump charge, including:
    (1) coupling a controllable conductivity device to a voltage source and to the voltage input of the pump charge, the controllable conductivity device having a control input for controlling the conductivity of the controllable conductivity device; and
    (2) coupling an output of an amplifier to the control input of the controllable conductivity device, coupling a first input of the amplifier to a reference voltage, and coupling a second input of the amplifier to the feedback signal; and
    (3) generating a control signal at the amplifier output that varies as a function of a difference between the feedback signal and the reference voltage, the control signal controlling the conductivity of the controllable conductivity device and thus the input voltage applied to the voltage input of the pump charge;
  (d) generating a clock signal from a clock source means having a voltage input coupled to the voltage source, a control input configured to receive a bias signal generated from the feedback signal, and a clock signal output coupled to the clock signal input of the charge pump, the clock signal having a frequency that is a function of the feedback signal through the bias signal, thereby controlling the amount of current available to the load coupled to the output of the charge pump as a function of the frequency of the clock signal, whereby as the load increases, the frequency of the clock signal increases and the current available from the charge pump increases, and as the load decreases, the frequency of the clock signal decreases and the current available from the charge pump decreases with a resulting decrease in electrical noise generated by the charge pump; and
  (e) generating a bias signal and coupling the generated bias signal to the output of the amplifier and to the control input of the clock source, thereby providing the bias signal to the clock source as a function of the feedback signal.

18. The method of claim 17, further including the step of randomly varying the frequency of the clock signal in order to spread generated spur signals.

* * * * *